United States Patent [19]

Au

[11] Patent Number: 4,617,480
[45] Date of Patent: Oct. 14, 1986

[54] HIGH SPEED DATA SYNCHRONIZER WHICH MINIMIZES CIRCUITRY

[75] Inventor: Kenneth K. Au, Austin, Tex.

[73] Assignee: Motorola, Inc., Schaumburg, Ill.

[21] Appl. No.: 663,517

[22] Filed: Oct. 22, 1984

[51] Int. Cl.⁴ ............................................. H03K 5/135
[52] U.S. Cl. .................................. 307/480; 307/452; 307/481; 307/359; 307/269
[58] Field of Search ................ 307/443, 448, 451–453, 307/480–481, 350, 358, 359, 582, 583, 269, 279

[56] References Cited

U.S. PATENT DOCUMENTS

| 3,764,920 | 10/1973 | Galcik et al. | 307/480 X |
| 3,984,703 | 10/1976 | Jorgensen | 307/443 X |
| 4,011,465 | 3/1977 | Alvarez, Jr. | 307/481 |
| 4,317,053 | 2/1982 | Shaw et al. | 307/452 X |
| 4,320,515 | 3/1982 | Burton, Jr. | 307/269 X |
| 4,476,401 | 10/1984 | Lin | 307/269 |
| 4,498,176 | 2/1985 | Wagner | 307/480 X |
| 4,539,489 | 9/1985 | Vaughn | 307/359 X |

FOREIGN PATENT DOCUMENTS 0741441 6/1980 U.S.S.R. ............... 307/480

Primary Examiner—Stanley D. Miller
Assistant Examiner—D. R. Hudspeth
Attorney, Agent, or Firm—Anthony J. Sarli, Jr.; Jeffrey Van Myers; Robert L. King

[57] ABSTRACT

A data synchronizer circuit which utilizes a CMOS process is provided. The synchronizer asynchronously receives input data and synchronizes the data to a predetermined clock signal. The synchronizer minimizes circuitry to provide fast operation and minimum latency between input and output terminals.

12 Claims, 3 Drawing Figures

*- PRIOR ART -*

HIGH SPEED DATA SYNCHRONIZER WHICH MINIMIZES CIRCUITRY

TECHNICAL FIELD

This invention relates generally to digital logic circuits, and more particularly, to a high speed data synchronizer for synchronizing an asynchronous input signal with a system clock and which minimizes circuitry.

BACKGROUND OF THE INVENTION

Digital circuits are typically interfaced with an asynchronous input signal by a synchronizer circuit to synchronize the input signal with a system clock or derivative thereof. A common problem with synchronizer circuits involves the reliable reading of asynchronous data which is transitioning during the change of the system clock. Such circuits often either incorrectly interpret the logic state of the input data or read the data as an indeterminate state. Previous synchronizer circuits have used a plurality of stages to obtain enough voltage gain to make a logic level determination. However, the plurality of stages generally requires a large amount of circuitry and is typically slow in providing a synchronized data signal because of clock delays. Other synchronizer circuits which are fast such as the synchronizer taught by Shaw et al. in U.S. Pat. No. 4,317,053 and assigned to the assignee hereof may be improved by using less circuitry.

SUMMARY OF THE INVENTION

Accordingly, an object of the present invention is to provide an improved high speed data synchronizer circuit which minimizes circuitry.

Another object of the present invention is to provide an improved high speed data synchronizer circuit which has high gain and which minimizes power consumption.

In carrying out the above and other objects of the present invention, there is provided, in one form a data synchronizer for synchronizing an asynchronous input signal with a synchronous clock signal. A first logic portion is provided for receiving the input signal and buffering the logic level of the input signal in response to the clock signal. A second logic portion is coupled to the first logic means for receiving the buffered input signal and providing an amplified output signal at an output terminal. A third logic portion is coupled to the output terminal for providing first and second control signals in response to both the output and clock signals. A fourth logic portion is coupled to the output terminal and further amplify the output signal in response to the first and second control signals.

DETAILED DESCRIPTION OF THE PRESENT INVENTION

Figure 1:
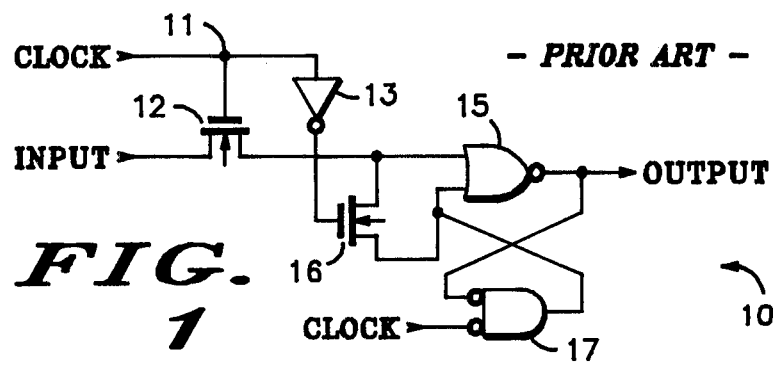
FIG. 1 illustrates in partial schematic form a synchronizer circuit known in the art.

Shown in FIG. 1 is a known synchronizer circuit 10 having a clock input terminal 11 for receiving a clock signal connected to both a gate of an N-channel transistor 12 and an input of an inverter circuit 13. A drain of transistor 12 is connected to an input terminal for receiving an input signal. A source of transistor 12 is connected to both a first input of a NOR gate 15 and a drain of an N-channel transistor 16. A gate of transistor 16 is connected to an output of inverter 13, and a source of transistor 16 is connected to both a second input of NOR gate 15 and an output of NOR gate 17. A first input of NOR gate 17 is coupled to the clock signal, and a second input of NOR gate 17 is coupled to the output of NOR gate 15.

In operation, synchronizer circuit 10 is a single stage synchronizer which provides a synchronized data signal at the output terminal after one transitioning clock edge of the clock signal. The clock signal must be at a high logic level to make transistor 12 conductive. Assuming that the clock signal constantly transitions, the logic level of the output signal remains constant as long as the logic level of the input signal does not transition. Should the input signal transition logic levels, the output terminal of synchronizer 10 will also transition in response to an immediately following clock signal transition. NOR gate 17 functions as a latch portion to latch the output of circuit 10 at the second input of NOR gate 15 via feedback. However, the feedback is interrupted on every transition of the clock signal which is coupled to the second input of NOR gate 17. Sycnhronizer circuit 10 is small in circuit size and operates in a very fast, efficient manner. It should however be noted that circuit 10 uses only transistors of a single conductivity type. Therefore, the uses of circuit 10 may be limited and unavailable in some processes such as complementary metal oxide semiconductor (CMOS).

A primary design objective of any synchronizer circuit is to provide a high voltage gain. The purpose of high voltage gain is to provide the maximum change of being able to determine the logic level of an input signal should the input signal be changing logic levels at the time the synchronous clock signal is also transitioning. Should the voltage gain provided for the input signal not be large enough, an output signal which is somewhere in an indeterminate logic level may result.

Figure 2:
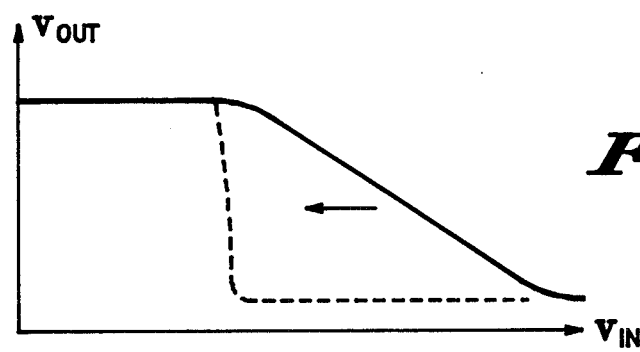
FIG. 2 illustrates in graphical form a voltage transfer curve for the synchronizer circuit of FIG. 1.

Shown in FIG. 2 by a solid curve is a voltage gain transfer curve for a conventional voltage amplifier. As can be readily seen, once the input voltage $V_{IN}$ increases beyond a certain magnitude, the output voltage $V_{OUT}$ slowly decreases in value. Therefore, the voltage gain, defined as the ratio of the output voltage to the input voltage, decreases insignificantly for a large range of increased input voltages. This is exactly the range of input voltages where indeterminate logic states exist and where the voltage gain should be the smallest. Therefore, shown by a dashed curve in FIG. 2 is an optimum voltage transfer curve in which high voltage gain is obtained for a specific range of input voltages and low voltage gain is obtained for input voltages having a larger magnitude than the specific range.

Figure 3:
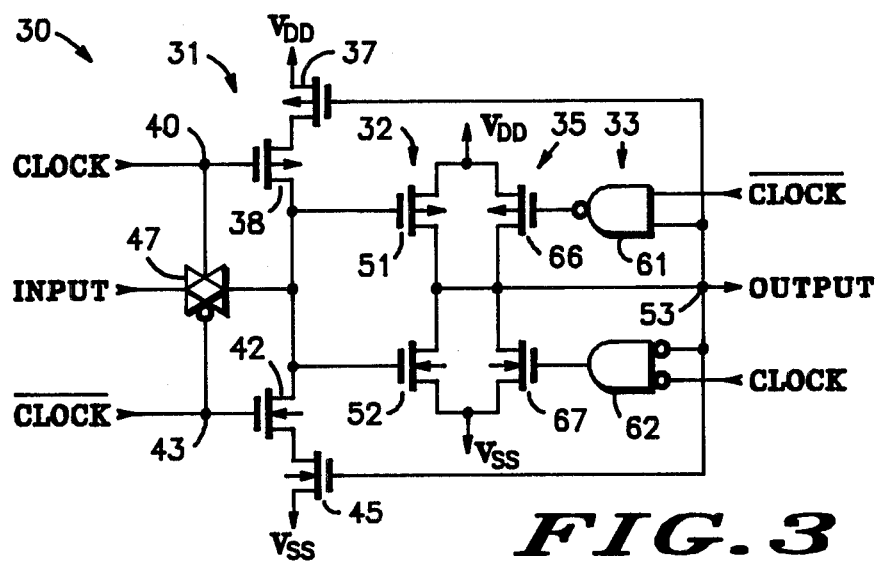
FIG. 3 illustrates in partial schematic form a synchronizer circuit in accordance with the present invention.

Shown in FIG. 3 is a synchronizer 30 which substantially implements the dashed voltage transfer curve of FIG. 2. Synchronizer circuit 30 generally comprises a first logic portion 31, a second logic portion 32, a third logic portion 33 and a fourth logic portion 35. First logic portion 31 includes a P-channel MOS transistor 37 having a first current electrode or a source coupled to a first power supply voltage, say $V_{DD}$. A drain of transistor 37 is connected to a source of a P-channel transistor 38. A gate of transistor 38 is connected to a terminal 40 for receiving a clock signal. In a preferred form, the clock signal is a synchronous square wave signal having a predetermined frequency. However, it should be obvious that other waveforms may be utilized for the clock signal. A drain of transistor 38 is connected to a drain of an N-channel transistor 42. A gate of transistor 42 is connected to a complement of the clock signal at a terminal 43. An N-channel transistor 45 has a drain connected to a source of transistor 42, and a source connected to a second power supply voltage $V_{SS}$. A CMOS transmission gate 47 has an input terminal for receiving an asynchronous input signal and an output terminal coupled to both drains of transistors 38 and 42. A first control input of a first conductivity type of transmission gate 47 is connected to terminal 40, and a second control input of a second conductivity type of transmission gate 47 is connected to terminal 43.

Second logic portion 32 comprises a P-channel MOS transistor 51 having a source connected to power supply $V_{DD}$, a gate connected to the drain of transistor 38, and a drain connected to a drain of an N-channel transistor 52 at an output terminal 53. A gate of transistor 52 is also connected to the drain of transistor 38. A source of transistor 52 is connected to power supply voltage $V_{SS}$.

Third logic portion 33 comprises a NAND gate 61 having a first input coupled to the complement of the clock signal, and a second input connected to a gate of transistor 37, to a gate of transistor 45 and to output terminal 53. A NOR gate 62 has a first input connected to output terminal 53 and to the gates of transistors 37 and 45. A second input of NOR gate 62 is coupled to the clock signal.

Fourth logic portion 35 comprises a P-channel MOS transistor 66 having a source connected to power supply voltage $V_{DD}$, a gate connected to an otput of NAND gate 61, and a drain connected to output terminal 53. An N-channel MOS transistor 67 has a drain connected to the drain of transistor 66 at output terminal 53. A gate of transistor 67 is connected to an output of NOR gate 62, and a source of transistor 67 is connected to power supply $V_{SS}$.

In operation, transmission gate 47 functions to alternately synchronously couple the input terminal thereof to the gates of transistors 51 and 52 in response to the clock signal changing logic levels. For the purpose of explanation only, assume initially that a low or zero logic level is present at output terminal 53 and that the clock signal is at a low logic level so that an input signal is not sampled. Therefore, transistor 37 is biased to be conductive and transistor 45 will be biased to be nonconductive. Transistors 38 and 42 are synchronously made jointly conductive in response to the clock signal being at a low logic level. As a result of the low clock signal and low input signal, the power supply potential $V_{DD}$ is initially coupled to the gates of transistors 51 and 52. In a preferred form, voltage $V_{SS}$ represents a low logic level and voltage $V_{DD}$ represents a high logic level. In response to the low clock signal and a low level input signal, second logic portion 32 couples a solid low logic level to output terminal 53 reinforcing the low logic level which was initially present. When the clock signal is at a low logic level, NOR gate 62 and NAND gate 61 each function as an inverter. As a result, the outputs of NOR gate 62 and NAND gate 61 are both at a high logic level making transistor 66 nonconductive and transistor 67 conductive. Therefore, fourth logic portion 35 also couples the low logic level $V_{SS}$ to output terminal 53 via transistor 67 to further reinforce a low logic level at the output of circuit 30.

Functionally, transmission gate 47 of first logic portion 31 and transistors 51 and 52 of second logic portion 32 serve as an input buffer to selectivevly receive and buffer the input signal. Transistors 37, 38, 42, and 45 of first logic portion 31 function as a first feedback portion to provide regenerative feedback. Transistors 66 and 67 of fourth logic portion 35 function as a second feedback portion to also provide regenerative feedback. Gates 61 and 62 of third logic portion 33 function as an amplifier.

Assume now that the clock signal changes logic level to a high logic level so that an input signal may be sampled via transmission gate 47. At some time during the period when the clock signal is present at a high logic level, assume that the input signal transitions to a good solid high logic level. Transistor 52 is immediately made strongly conductive and transistor 51 made nonconductive. Therefore, the solid low logic level of $V_{SS}$ is coupled to output terminal 53 which is fed back to the gates of transistors 37 and 45. Transistor 37 is made conductive and transistor 45 nonconductive, thereby further reinforcing the high logic level present at the gates of transistors 51 and 52. Therefore, the output of synchronizer 30 is synchronously at a low logic level when an input signal is at a high logic level during the sample period. Similarly, during the sample period, if the input signal is at a low logic level, the output of synchronizer 30 is synchronously at a high logic level. Synchronizer 30 is capable of substantially implementing the voltage transfer curve shown in FIG. 2 by use of the regenerative feedback provided by logic portions 31 and 35. Because logic portion 33 quickly amplifies any weak logic levels present at output terminal 53, a quick transition of output logic levels is realized for a small change of input voltage at a predetermined logic transition point.

Assume however that during a sample period the input signal is at a low logic level until the end of the sample period. As the clock signal changes logic levels from high to low, assume the input signal is somewhere between a low logic level and a high logic level so that the input signal is only at a semi-high logic level. A problem associated with prior art circuits has been that a metastable condition may result in this situation. However, the present invention functions in a manner to avoid a metastable output condition for this type of circuit condition. In operation, the basically high logic level of the input signal is coupled directly to the gates of transistors 51 and 52 which tends to bias transistor 51 off and bias transistor 52 on. The immediate effect of transistor 52 becoming partially conductive is to couple at least a semi-low logic level to the gates of transistors 37 and 45 and to an input of each of logic gates 61 and 62. As a result, transistor 37 is partially turned on and transistor 45 is partially turned off. However, at this time, transistors 38 and 42 are biased nonconductive by the clock signal and the complement thereof, respectively. Simultaneously, both inputs of NAND gate 61 are at a low logic level to provide an amplified high logic level output which disables transistor 66, and NOR gate 62 provides a low logic level output which also disables transistor 67. Therefore, during the end of a sample period when only a semi-high logic level input signal is present due to a transition of the input signal, output terminal 53 is at a semi-low logic level which is low enough to be detected by other circuitry as a logic low and not an indeterminate state.

Assume now that the clock signal transitions from a high to a low logic level indicating the end of a sample period. Transistors 38 and 42 again become conductive. The semi-low logic level at output terminal 53 is fed back to the gates of transistors 37 and 45 to make transistor 37 primarialy conductive and transistor 45 primarily nonconductive. Therefore, a substantial portion of supply voltage $V_{DD}$ is coupled to the gates of transistors 51 and 52 reinforcing the partial high logic level already present. Simultaneously, NAND gate 61 and NOR gate 62 function as inverters in response to the partial low input from output terminal 53 and the low level clock signal to provide an amplified high output signal at each output thereof. As a result of this regenerative feedback, transistor 66 is made nonconductive and transistor 67 is made conductive thereby coupling a solid low logic level to output terminal 53. It should be readily apparent that the present invention also prevents a metastable output condition for the situation where the input signal is transitioning from a high logic level to a low logic level during the time when the clock signal is also transitioning from a high logic level to a low logic level. The operation of synchronizer 30 under this condition is analogous to the first possible metastable condition discussed above. Although specific N-channel and P-channel transistors have been illustrated, it should be readily apparent that the present invention may be practised by using other types of transistors or by reversing the processing techniques (e.g. P-channel to N-channel).

By now it should be apparent that a high speed data synchronizer circuit which minimizes circuitry has been provided. The present invention operates quickly by virtue of the fact that a synchronized output signal appears within one inverter stage of delay after an asynchronous input signal has been presented at the input terminal and within one edge transition of a synchronizing clock signal. In other words, the present invention has minimized latency to a one-half synchronous clock cycle. Logic portions 32 and 35 may be easily designed to have a large gain to improve the reliability of circuit 30 by improving the determination capability of logic level of a transitioning input signal at the edge of the synchronous clock signal.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spriit and scope of the invention.

I claim:

1. A high speed data synchronizer circuit for synchronizing an asynchronous input signal with a synchronous clock signal, comprising:
    first logic means for receiving the clock signal and a complement thereof and selectively receiving the input signal and buffering the input signal to provide a first control signal;
    second logic means coupled to the first logic means, for providing a buffered output signal at an output terminal in response to the first control signal;
    third logic means coupled to the output terminal, to the clock signal and to a complement thereof, for providing second and third control signals in response to both the output and clock signals; and
    fourth logic means coupled to the output terminal, for further amplifying the output signal in response to said second and third control signals.

2. The high speed data synchronizer circuit of claim 1 wherein the first logic means buffers and level shifts the logic level of the input signal to a first or a second power supply voltage level in response to the output signal.

3. The high speed data synchronizer circuit of claim 1 wherein said second logic means comprise: an inverter stage having an input coupled to the first logic means, and an output coupled to the output terminal.

4. The high speed data synchronizer circuit of claim 1 wherein said fourth logic means comprise:
    an inverter stage having first and second inputs coupled to the third logic means, and an output coupled to the output terminal.

5. The high speed data synchronizer circuit of claim 1 wherein said first logic means comprise:
    a first transistor of a first conductivity type having a control electrode for receiving the clock signal, and first and second current electrodes;
    a second transistor of the first conductivity type having a control electrode coupled to the output terminal, a first current electrode coupled to the first current electrode of the first transistor, and a second current electrode coupled to a first power supply voltage terminal;
    a third transistor of a second conductivity type having a control electrode coupled to a complement of the clock signal, a first current electrode coupled to the second current electrode of the first transistor, and a second current electrode;
    a fourth transistor of the second conductivity type having a control electrode coupled to the output terminal, a first current electrode coupled to the second current electrode of the third transistor, and a second current electrode coupled to a second power supply voltage terminal; and
    switching means for selectively coupling the input signal to the second current electrode of the first transistor in response to the clock signal.

6. The high speed data synchronizer circuit of claim 5 wherein said switching means further comprise a complementary MOS switch having a first terminal for receiving the input signal, a second terminal coupled to the second current electrode of the first transistor, a first control electrode coupled to the clock signal, and a second control electrode coupled to a complement of the clock signal.

7. The high speed data synchronizer circuit of claim 5 wherein said second logic means further comprise:
    a fifth transistor of the first conductivity type having a first current electrode coupled to the first power supply voltage terminal, a control electrode coupled to the second current electrode of the first transistor, and a second current electrode coupled to the output terminal; and
    a sixth transistor of the second conductivity type having a first current electrode coupled to the second current electrode of the fifth transistor, a control electrode coupled to the second current electrode of the first transistor, and a second current electrode coupled to the second power supply voltage terminal.

8. The high speed data synchronizer circuit of claim 7 wherein said fourth logic means further comprise:

a seventh transistor of the first conductivity type having a first current electrode coupled to the first power supply voltage terminal, a control electrode coupled to the second control signal, and a second current electrode coupled to the output terminal; and an eighth transistor of the second conductivity type having a first current electrode coupled to the output terminal, a control electrode coupled to the third control signal, and a second current electrode coupled to the second power supply voltage terminal.

9. A high speed synchronizer circuit for synchronizing an asynchronous input signal with a synchronous clock signal, comprising:

input means for selectively receiving the input signal and selectively providing the input signal as a control signal;

amplifier means coupled to the input means for providing an amplified output signal in response to the control signal;

first feedback means coupled to the input means for coupling the input signal to one of a first or second power supply terminal in response to the output signal; and second feedback means coupled in parallel with the amplifier means, for coupling the output signal to the first or second power supply terminal in response to both the amplified output signal and the clock signal.

10. The high speed data synchronizer circuit of claim 9 wherein said input means comprises:

a CMOS inverter responsive to the synchronous clock signal and having an output for providing the control signal; and a CMOS transmission gate for selectively coupling the input signal to the CMOS inverter in response to the clock signal and complement thereof.

11. The high speed data synchronizer circuit of claim 9 wherein said second feedback means is a CMOS inverter responsive to logic means controlled by the output signal and the clock signal.

12. A data synchronizer circuit for synchronizing an asynchronous input signal with a synchronous clock signal, comprising:

switching means for selectively coupling the input signal to an input node in response to the clock signal;

a first transistor of a first conductivity type having a first current electrode connected to a first power supply voltage terminal, a control electrode connected to an output terminal, and a second current electrode;

a second transistor of the first conductivity type having a first current electrode connected to the second current electrode of the first transistor, a control electrode coupled to the clock signal, and a second current electrode connected to the input node;

a third transistor of a second conductivity type having a first current electrode connected to the input node, a control electrode coupled to a complement of the clock signal which is coupled to the control electrode of the second transistor, and a second current electrode;

a fourth transistor of the second conductivity type having a first current electrode connected to the second current electrode of the third transistor, a control electrode connected to the output terminal, and a second current electrode connected to a second power supply voltage terminal;

a fifth transistor of the first conductivity type having a first curernt electrode connected to the first power supply voltage terminal, a control electrode connected to the input node, and a second current electrode connected to the output terminal;

a sixth transistor of the second conductivity type having a first current electrode connected to the output terminal, a control electrode connected to the input node, and a second current electrode connected to the second power supply voltage terminal;

a seventh transistor of the first conductivity type having a first current electrode connected to the first supply voltage terminal, a control electrode, and a second current electrode connected to the output terminal;

an eight transistor of the second conductivity type having a first current electrode connected to the output terminal, a control electrode, and a second current electrode connected to the second power supply voltage terminal; and logic means coupled to both the output terminal and the clock signal, for providing control signals to the control electrodes of the seventh and eighth transistors.

* * * * *